United States Patent
Huang et al.

(10) Patent No.: US 11,356,058 B1
(45) Date of Patent: Jun. 7, 2022

(54) OSCILLATOR WITH FREQUENCY VARIATION COMPENSATION

(71) Applicant: Cypress Semiconductor Corporation, San Jose, CA (US)

(72) Inventors: Chenxi Huang, San Jose, CA (US); Yung Chen, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 17/125,168

(22) Filed: Dec. 17, 2020

(51) Int. Cl.
H03B 5/04 (2006.01)
H03B 5/12 (2006.01)
H03L 7/099 (2006.01)

(52) U.S. Cl.
CPC ............. H03B 5/04 (2013.01); H03B 5/1206 (2013.01); *H03L 7/099* (2013.01)

(58) Field of Classification Search
CPC ........................................................ H03B 5/04
USPC ........................................................... 331/66
See application file for complete search history.

(56) References Cited

U.S. PATENT DOCUMENTS

| | | | |
|---|---|---|---|
| 5,973,519 A | 10/1999 | Yamashita | |
| 7,098,751 B1 * | 8/2006 | Wong | H03B 5/1231 331/117 R |
| 7,116,183 B2 | 10/2006 | Wu | |
| 7,161,440 B2 | 1/2007 | Meltzer | |
| 7,164,325 B2 | 1/2007 | Aparin et al. | |
| 7,167,058 B2 | 1/2007 | Meltzer | |
| 7,336,134 B1 * | 2/2008 | Janesch | H03L 7/0991 331/117 R |
| 8,022,780 B2 | 9/2011 | Taghivand et al. | |
| 8,248,167 B2 | 8/2012 | Bolton | |
| 8,253,506 B2 | 8/2012 | Liu et al. | |
| 8,289,094 B2 | 10/2012 | Wennekers et al. | |
| 9,231,519 B2 | 1/2016 | Wei et al. | |
| 9,438,249 B1 | 9/2016 | Nguyen et al. | |
| 9,853,648 B2 | 12/2017 | Su et al. | |
| 2012/0223771 A1 * | 9/2012 | Zhang | H03L 1/02 327/586 |

FOREIGN PATENT DOCUMENTS

KR    101616480 B1    4/2016

OTHER PUBLICATIONS

Wu, Guoying, "A Low-Voltage And Temperature Compensated Ring VCO Design," IEEE Dallas Circuits and Systems Conference, Oct. 2014, pp. 1-4; 4 pages.

* cited by examiner

Primary Examiner — Joseph Chang (57) ABSTRACT

An example voltage controlled oscillator includes an inductor, a capacitor coupled to the inductor, and a signal source coupled to the inductor and the capacitor to sustain an oscillating signal. The voltage controlled oscillator includes a first varactor coupled to the inductor and the capacitor, wherein the first varactor is biased by a first bias voltage and is configured to change a frequency of the oscillating signal based on a first control voltage signal. The voltage controlled oscillator includes a second varactor coupled to the inductor, the capacitor, and the first varactor, wherein the second varactor is biased by a second bias voltage and is configured to compensate temperature variation of the frequency of the oscillating signal over a plurality of frequency bands based on second control voltage signal.

20 Claims, 6 Drawing Sheets

| | TT | | FastLow | | SlowHigh | | SnFp | | FnSp | |
|---|---|---|---|---|---|---|---|---|---|---|
| | FREQ | VCTRL | FREQ | VCTRL | FREQ | VCTRL | FREQ | VCTRL | FREQ | VCTRL |
| UNCOMPENSATED VARIATION (502) | | | | | | | | | | |
| HIGH CHANNEL(4.96G) | 0.356M | 8.9mV | 2.762M | 69.05mV | 2.718M | 67.95mV | 0.224M | 5.60mV | 7.207M | 180.2mV |
| MID CHANNEL(4.88G) | 1.459M | 36.48mV | 3.551M | 88.78mV | 2.082M | 52.05mV | 1.233M | 30.83mV | 5.392M | 134.8mV |
| LOW CHANNEL(4.8G) | 2.280M | 57mV | 4.392M | 109.8mV | 1.381M | 34.53mV | 2.193M | 54.83mV | 3.177M | 79.43mV |
| COMPENSATED VARIATION WITH FIXED VBAND CODE (504) | | | | | | | | | | |
| HIGH CHANNEL(4.96G) | 1.188M | 29.70mV | 3.808M | 95.20mV | 1.227M | 30.68mV | 2.973M | 74.33mV | 0.169M | 4.23mV |
| MID CHANNEL(4.88G) | 0.033M | 0.83mV | 2.475M | 61.88mV | 0.026M | 0.65mV | 1.635M | 40.88mV | 1.309M | 32.73mV |
| LOW CHANNEL(4.8G) | 1.310M | 32.72mV | 1.115M | 27.88mV | 1.266M | 31.65mV | 0.233M | 5.83mV | 2.499M | 62.48mV |
| COMPENSATED VARIATION WITH DIFFERENT VBAND CODES (506) | | | | | | | | | | |
| HIGH CHANNEL(4.96G) | 0.023M | 0.58mV | 0.428M | 10.7mV | 0.272M | 6.8mV | 0.327M | 8.18mV | 0.070M | 1.75mV |
| MID CHANNEL(4.88G) | 0.013M | 0.33mV | 0.136M | 3.4mV | 0.063M | 1.58mV | 0.308M | 7.70mV | 0.023M | 0.58mV |
| LOW CHANNEL(4.8G) | 0.372M | 9.3mV | 0.400M | 10.0mV | 0.021M | 0.53mV | 0.156M | 3.90mV | 0.026M | 0.70mV |

OSCILLATOR WITH FREQUENCY VARIATION COMPENSATION

BACKGROUND

A phase-locked loop (PLL) may be used for data and telecommunications, frequency synthesis, clock recovery, and similar applications. A PLL may include a variable oscillator combined with phase detection and control circuitry. The oscillator output after division may be continuously compared against an incoming clock signal (e.g., a reference clock signal from a crystal oscillator) and adjusted to be at the same phase and frequency as the reference clock signal. Some PLLs may include a voltage controlled oscillator (VCO) that may be sensitive to variations in process and temperature. In some cases, variations in process and temperature may cause the VCO frequency to shift outside of a target range.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Some examples disclosed herein are directed to an electronic oscillator, and more particularly, to a VCO having an inductor-capacitor ("LC") tank resonator and having a resonant frequency that is controlled by a control voltage signal. Examples of the electronic oscillator include compensation circuitry to compensate temperature based frequency variations. "LC" resonators are so named because the traditional symbols for inductance and capacitance are L and C, respectively. The LC tank resonator uses both inductors and capacitors, and may include multiple stages that may be selectively switched into or out of the circuit. Each stage has a characteristic resonant frequency. At the resonant frequency, the impedance of the LC network becomes real (since, at resonance, the inductive and capacitive reactance become equal in magnitude and opposite in sign, and therefore, cancel). An LC resonator may oscillate at the resonant frequency of the LC networks in its stages.

A further consideration with regard to oscillators is frequency modulation. Some applications may involve adjusting the frequency of the oscillator. This may be done through the inclusion of a variable reactive component (i.e., inductance or capacitance). The resonant frequency is inversely proportional to the square root of the product of the inductance and capacitance. Therefore, varying either the capacitance or the inductance changes the operating frequency of the oscillator. When the variable reactive component is voltage-dependent, the frequency of the oscillator may be adjusted through the application of an external control voltage. This is a form of a VCO. An example of a voltage-dependent capacitor is the varactor. A varactor may be a semiconductor junction that is biased in the reverse direction and can be tuned over a range of capacitance by varying its junction voltage. Frequency modulation can, therefore, be performed by changing the capacitance values of the oscillator.

Examples of the VCO disclosed herein may be incorporated into a phase-locked loop (PLL). PLLs may be used for data and telecommunications, frequency synthesis, clock recovery, and similar applications. A PLL may include a variable oscillator combined with phase detection and control circuitry. The oscillator output after division may be continuously compared against an incoming clock signal (e.g., a reference clock signal from a crystal oscillator) and adjusted to be at the same phase and frequency as the reference clock signal. LC-type VCOs may be used in PLL designs tailored for wireless and low power applications, as well as other applications involving precise timing. Some LC-type VCOs may be sensitive to variations in process and temperature. In some cases, variations in process and temperature may cause the VCO frequency to shift outside of a target range, thereby limiting the usable process and temperature of the PLL device.

Oscillators may suffer from frequency drift caused by environmental changes, such as temperature; and internal parameters, such as the design characteristics of semiconductor layout and the overall fluctuations or changes from run-to-run in the fabrication or processing of the oscillator components. For oscillators that are selectively operated in multiple different frequency bands, the frequency drift may vary across the various frequency bands. VCO frequency variation over temperature will change the voltage sensitivity, KVCO, of the VCO. For low power wireless transmission structures (e.g., Bluetooth), the change in KVCO of the VCO may affect the PLL loop stability, and may cause failure in stable modulation index tests and Bluetooth modulation characteristics tests. For high power wireless transmission structures (e.g., WiFi), the VCO frequency drifts over temperature may potentially cause the PLL to be unable to acquire lock.

Examples herein are directed to a VCO with a compensation system to cancel frequency variation over temperature, process variations or "corners", and different frequency bands. Some examples add a compensating varactor to the VCO and apply a compensating voltage to the compensating varactor to produce a non-drifted oscillating signal frequency from the VCO.

Figure 1:
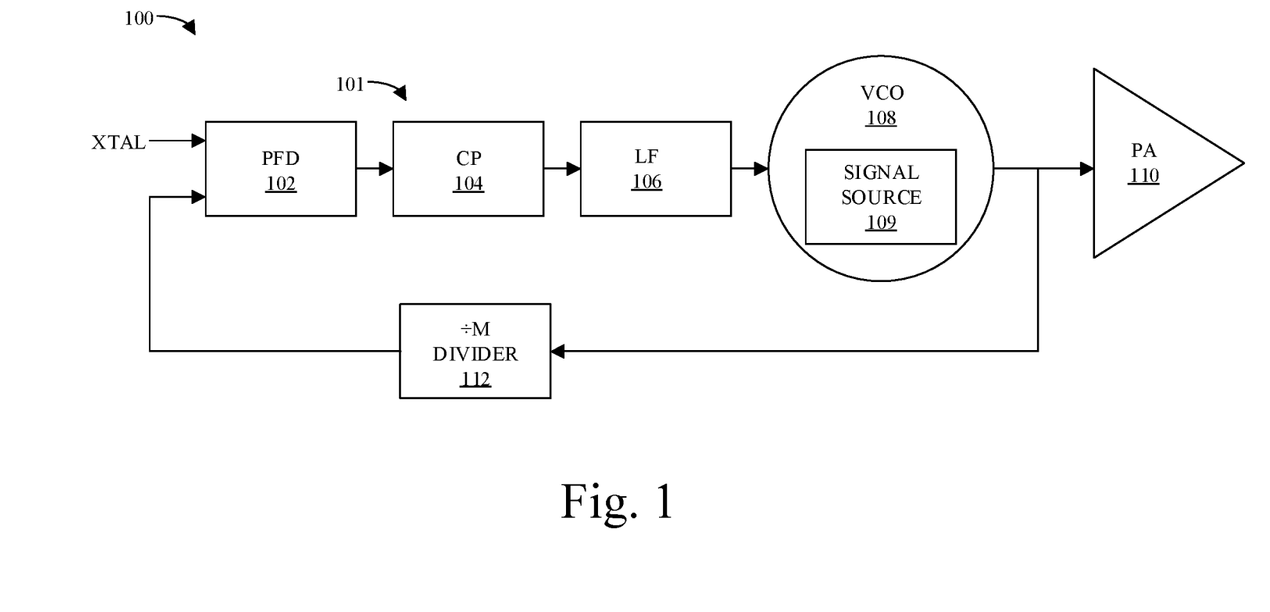
FIG. 1 is a block diagram illustrating a phase-locked loop (PLL) electronic system according to an example.

FIG. 1 is a block diagram illustrating a phase-locked loop (PLL) electronic system 100 according to an example. PLL electronic system 100 includes PLL 101 and power amplifier (PA) 110. PLL 101 includes phase frequency detector (PFD) 102, charge pump (CP) 104, low-pass filter 106 (LF), VCO 108, and frequency divider (div M) 112. VCO 108 includes signal source 109. During operation according to an example, phase frequency detector 102 receives a reference clock signal from an external source (e.g., a crystal oscillator (XTAL)). The phase frequency detector 102 compares the reference signal to a feedback signal generated by components within the PLL circuit 101. The phase frequency detector 102 may detect differences in frequency and/or phase between the reference and feedback clock signals, and generate compensating "up" and "down" signals in response thereto. The particular control signals generated depend on whether the feedback clock signal is lagging or leading the reference clock signal in frequency or phase.

The up/down control signals are passed through charge pump 104 and low-pass filter 106 to integrate the control signals into a control voltage, which is sent to the VCO 108. The VCO 108 converts the voltage information into an oscillating output signal that may be amplified by power amplifier 110. Signal source 109 provides a current or voltage signal to sustain oscillations by the VCO 108. The oscillating output signal may be fed back to the phase frequency detector 102 via a feedback loop. Frequency divider 112 may be included in the feedback path for adjusting the frequencies of the feedback signal. For example, frequency divider 112 may be used for dividing the frequency of the VCO output signal ($F_{OUT}$) to produce a divided down feedback signal ($F_{OUT}/M$).

Figure 2:
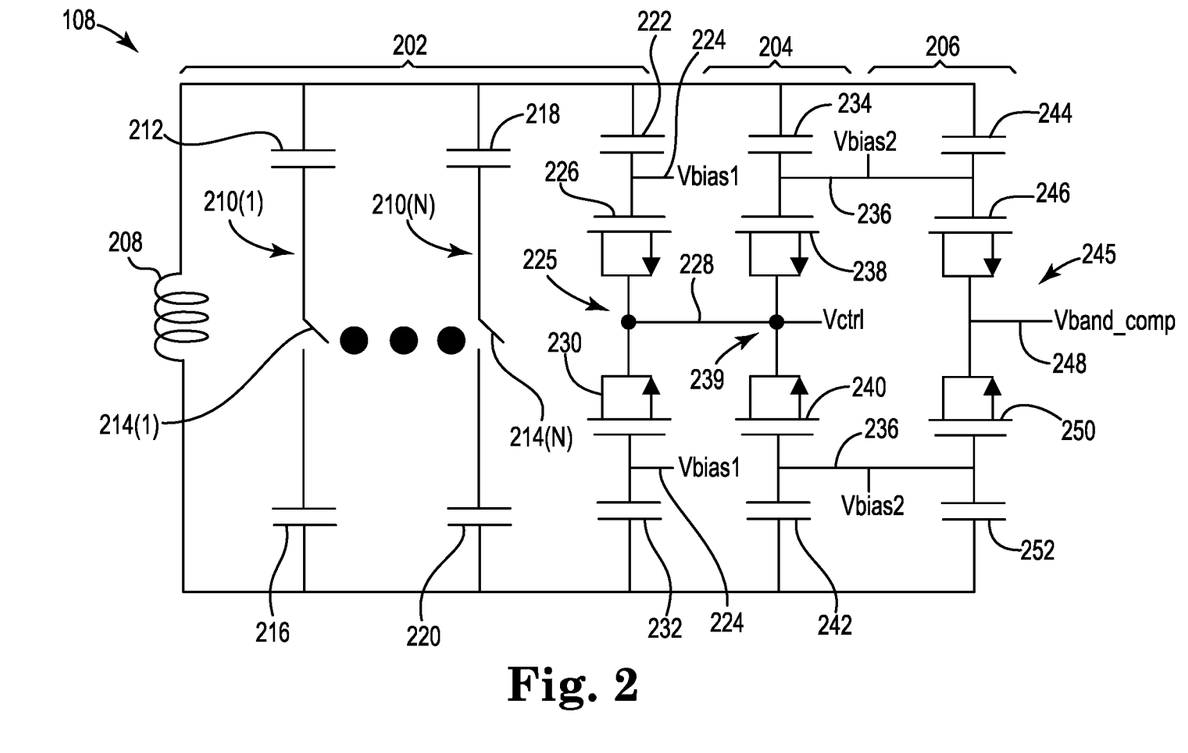
FIG. 2 is a schematic diagram illustrating some circuitry of the VCO of the PLL shown in FIG. 1 according to an example.

FIG. 2 is a schematic diagram illustrating circuitry of the VCO 108 of the PLL 101 shown in FIG. 1 according to an example. VCO 108 includes LC tank resonator circuitry 202, linear adjustment circuitry 204, and frequency compensation circuitry 206. VCO 108 also includes signal source 109 (FIG. 1). LC tank resonator circuitry 202 includes inductor 208 and a switched capacitor bank with N capacitor stages 210(1)-210(N) (collectively referred to as capacitor stages 210), where N is an integer greater than one. In the illustrated example, each capacitor stage 210 includes two capacitors and a switch, which are all connected in series. The capacitor stages 210 are coupled in parallel to each other and to the inductor 208. Capacitor stage 210(1) includes switch 214(1) and capacitors 212 and 216. Capacitor stage 210(N) includes switch 214(N) and capacitors 218 and 220. Switches 214(1)-214(N) are collectively referred to as switches 214. One or more selected capacitor stages 210 may be switched on (i.e., switch 214 for the selected stage is closed, while the switches 214 for the remaining capacitor stages 210 remain open, to alter the frequency band at which the VCO 108 oscillates. Thus, the capacitor stages 210 provide for a coarse adjustment of frequency (e.g., by causing a discrete adjustment from one frequency band or channel to another frequency band or channel), and varactors may be used for fine and continuous adjustment of frequency within the selected frequency band. In an example, the frequency bands of the VCO 108 are non-overlapping, and "coarse" adjustment refers to a switch from one frequency band to another, while a "fine" adjustment refers to a switch in frequency within a particular frequency band.

LC tank resonator circuitry 202 also includes capacitors 222 and 232 and varactor 225, which are all coupled in series to each other, and the series combination is coupled in parallel to the inductor 208 and capacitor stages 210. In the illustrated example, varactor 225 is implemented with two varactor diodes 226 and 230. The varactor 225 may be created by placing n+ diffusion regions of an NMOS device in an n well region of the device. The varactor diodes 226 and 230 have a common anode connection 228 to which a control voltage ($V_{ctrl}$) may be coupled. A first bias voltage ($V_{bias1}$) is coupled to a node between the capacitor 222 and the cathode of the varactor diode 226, and the first bias voltage ($V_{bias1}$) is also coupled to a node between the capacitor 232 and the cathode of the varactor diode 230.

Linear adjustment circuitry 204 includes capacitors 234 and 242 and varactor 239, which are all coupled in series to each other, and the series combination is coupled in parallel to the inductor 208, capacitor stages 210, and the series combination of capacitors 222 and 232 and varactor 225. In the illustrated example, varactor 239 is implemented with two varactor diodes 238 and 240. The varactor 239 may be created by placing n+ diffusion regions of an NMOS device in an n well region of the device. The varactor diodes 238 and 240 have a common anode connection 228 to which the control voltage ($V_{ctrl}$) may be coupled. A second bias voltage ($V_{bias2}$) is coupled to a node between the capacitor 234 and the cathode of the varactor diode 238, and the second bias voltage ($V_{bias2}$) is also coupled to a node between the capacitor 242 and the cathode of the varactor diode 240. Linear adjustment circuitry 204 helps to make the voltage sensitivity, KVCO, of the VCO 108, more linear. The KVCO is in units of Hz/V, and provides a measure of change in output frequency per change in input voltage.

Frequency compensation circuitry 206 includes capacitors 244 and 252 and varactor 245, which are all coupled in series to each other, and the series combination is coupled in parallel to the inductor 208, capacitor stages 210, the series combination of capacitors 222 and 232 and varactor 225, and linear adjustment circuitry 204. In the illustrated example, varactor 245 is implemented with two varactor diodes 246 and 250. The varactor 245 may be created by placing n+ diffusion regions of an NMOS device in an n well region of the device. The varactor diodes 246 and 250 have a common anode connection 248 to which a compensation control voltage ($V_{band\_comp}$) may be coupled. The second bias voltage ($V_{bias2}$) is coupled to a node between the capacitor 244 and the cathode of the varactor diode 246, and the second bias voltage ($V_{bias2}$) is also coupled to a node between the capacitor 252 and the cathode of the varactor diode 250.

Frequency compensation circuitry 206 cancels frequency variation over temperature, process variation categories or "corners", and different frequency bands of the VCO 108. Adding a compensating varactor 245 to the VCO and applying a compensation control voltage ($V_{band\_comp}$) to the compensating varactor 245 helps to produce a non-drifted oscillating signal frequency by the VCO 108. The compensating varactor 245 and compensation control voltage provide an extra degree of freedom to compensate the frequency temperature variation over different frequency bands, while at the same time the two bias voltages ($V_{bias1}$ and $V_{bias2}$) help to operate the varactors in a good KVCO range.

Figure 3:
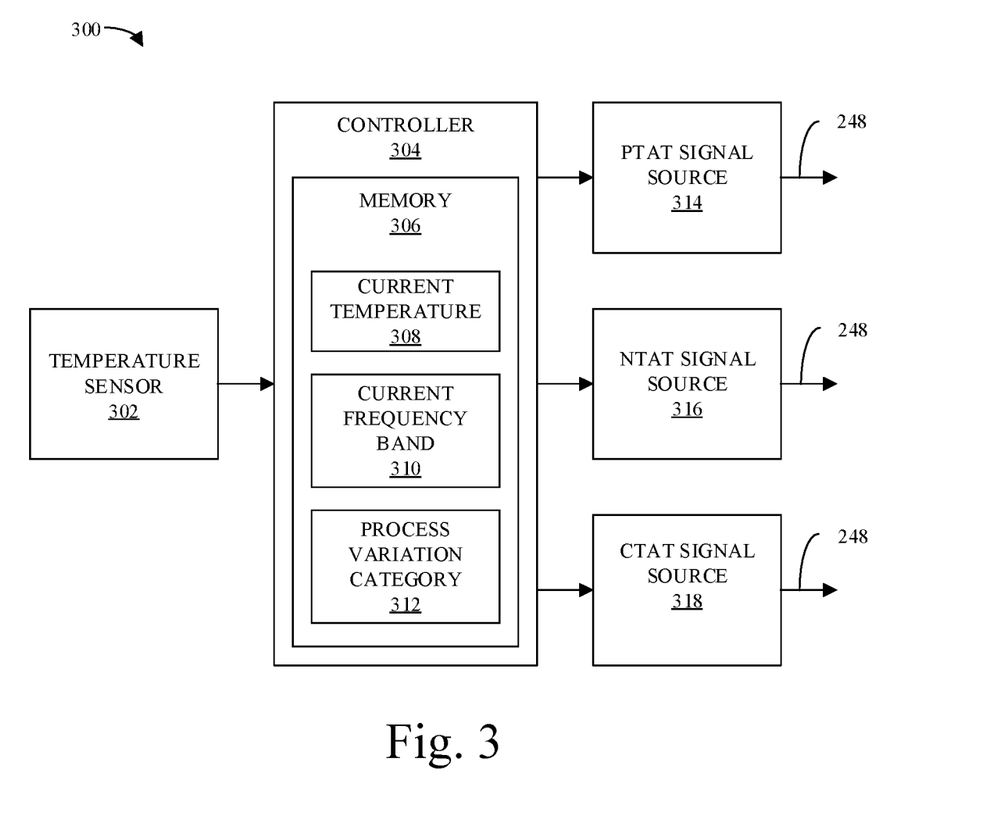
FIG. 3 is a block diagram illustrating circuitry for generating a compensation control signal for the frequency compensation circuitry shown in FIG. 2 according to an example.

FIG. 3 is a block diagram illustrating circuitry 300 for generating a compensation control signal (e.g., $V_{band\_comp}$ applied to common anode connection 248) for the frequency compensation circuitry 206 shown in FIG. 2 according to an example. The circuitry 300 includes temperature sensor 302, controller 304, proportional-to-absolute-temperature (PTAT) signal source 314, negative-to-absolute-temperature (NTAT) signal source 316, and a constant-to-absolute-temperature (CTAT) signal source 318. In an example, signal sources 314, 316, and 318 are voltage signal sources. In other examples, signal sources 314, 316, and 318 may be current signal sources. Controller 304 may include memory 306. In other examples, memory 306 may be separate from controller 304 and may be accessed by controller 304.

Memory 306 stores current temperature 308 of the VCO 108 (as measured by temperature sensor 302), current frequency band 310 at which the VCO 108 is operating, and process variation category 312 of the VCO 108.

Controller 304 may include a processor, such as a central processing unit (CPU) or another suitable processor. In an example, memory 306 stores machine readable instructions that are executed by controller 304. Memory 306 includes any suitable combination of volatile and/or non-volatile memory, such as combinations of Random-Access Memory (RAM), Read-Only Memory (ROM), flash memory, and/or other suitable memory. These are examples of non-transitory computer readable media (e.g., non-transitory computer-readable storage media storing computer-executable instructions that when executed by at least one processor cause the at least one processor to perform a method). The memory 306 is non-transitory in the sense that it does not encompass a transitory signal but instead is made up of at least one memory component to store machine executable instructions for performing techniques described herein. In addition, various components described herein may be implemented as software modules, hardware modules, special-purpose hardware (e.g., application specific hardware, application specific integrated circuits (ASICs), embedded controllers, hardwired circuitry, etc.), or some combination of these.

To determine how the frequency of VCO 108 varies based on temperature, frequency band, and process variation category, the VCO 108 may be simulated through computerized modeling or the like. A calibration process may also be performed before or during normal operation of the VCO 108 to determine frequency variations based on temperature, frequency band, and process category. For example, the VCO 108 may be tested during the manufacturing test process to identify process variations and determine a process variation category 312 for the VCO 108. The VCO 108 may also be tested in the field using a built-in-self-test or using external equipment.

In some examples, the operating frequency of VCO 108 is measured at a plurality of different temperatures (e.g., 0° C., 60° C., etc.) to determine whether the frequency changes with temperature. In some examples, if the frequency does not change with temperature, no compensation is applied. If the frequency changes with temperature, one of the signal sources 314, 316, or 318 is selected and controlled by controller 304 to provide a compensation signal at common anode connection 248 to compensate the frequency drift. In some examples, controller 304 takes into account the current temperature 308, current frequency band 310, and the process variation category 312 of the VCO 108 in selecting and controlling the signal sources 314, 316, and 318 to compensate frequency drift over temperature, frequency bands, and process variations.

Figure 4:
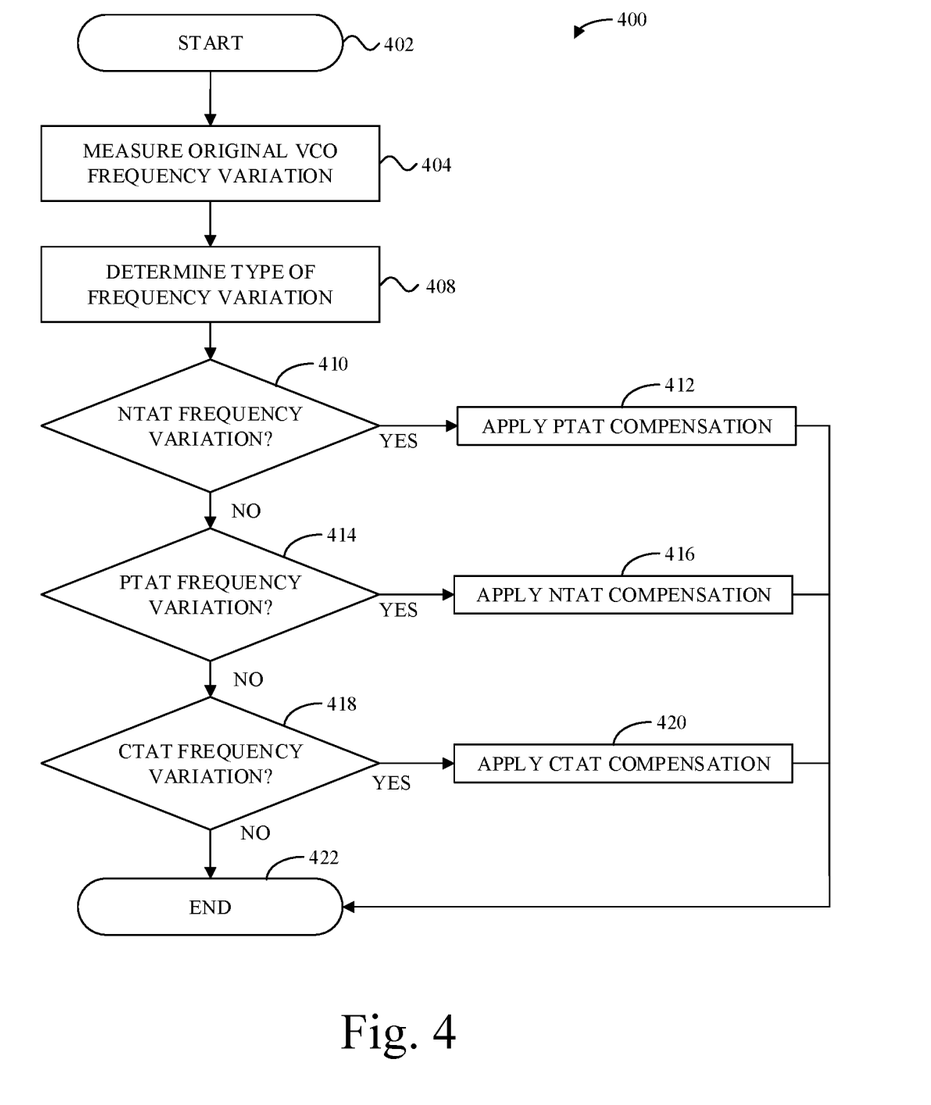
FIG. 4 is a flow diagram illustrating a method of compensating frequency drift in a VCO according to an example.

FIG. 4 is a flow diagram illustrating a method 400 of compensating frequency drift in a VCO according to an example. At 402, the method 400 starts. At 404, the method 400 includes measuring the original VCO frequency variation based on temperature. In some examples, the operating frequency of the VCO is measured at a plurality of different temperatures at 404 to determine whether the frequency changes with temperature. The method 400 then moves to 408 to determine the type of frequency variation (e.g., NTAT, PTAT, or CTAT). At 410, if the type of frequency variation is determined to be NTAT, the method 400 moves to 412 to apply PTAT compensation, and then the method 400 moves to 422, which represents the end of the method 400. At 414, if the type of frequency variation is determined to be PTAT, the method 400 moves to 416 to apply NTAT compensation, and then the method 400 moves to 422, which represents the end of the method 400. At 418, if the type of frequency variation is determined to be CTAT, the method 400 moves to 420 to apply CTAT compensation, and then the method 400 moves to 422, which represents the end of the method 400.

In an example, controller 304 (FIG. 3) selects and controls signal sources 314, 316, and 318 to provide PTAT, NTAT, and CTAT compensation signals, respectively, for method 400. In some examples, controller 304 controls the signal sources 314, 316, and 318 to compensate frequency drift over temperature, frequency bands, and process corners.

Figure 5:
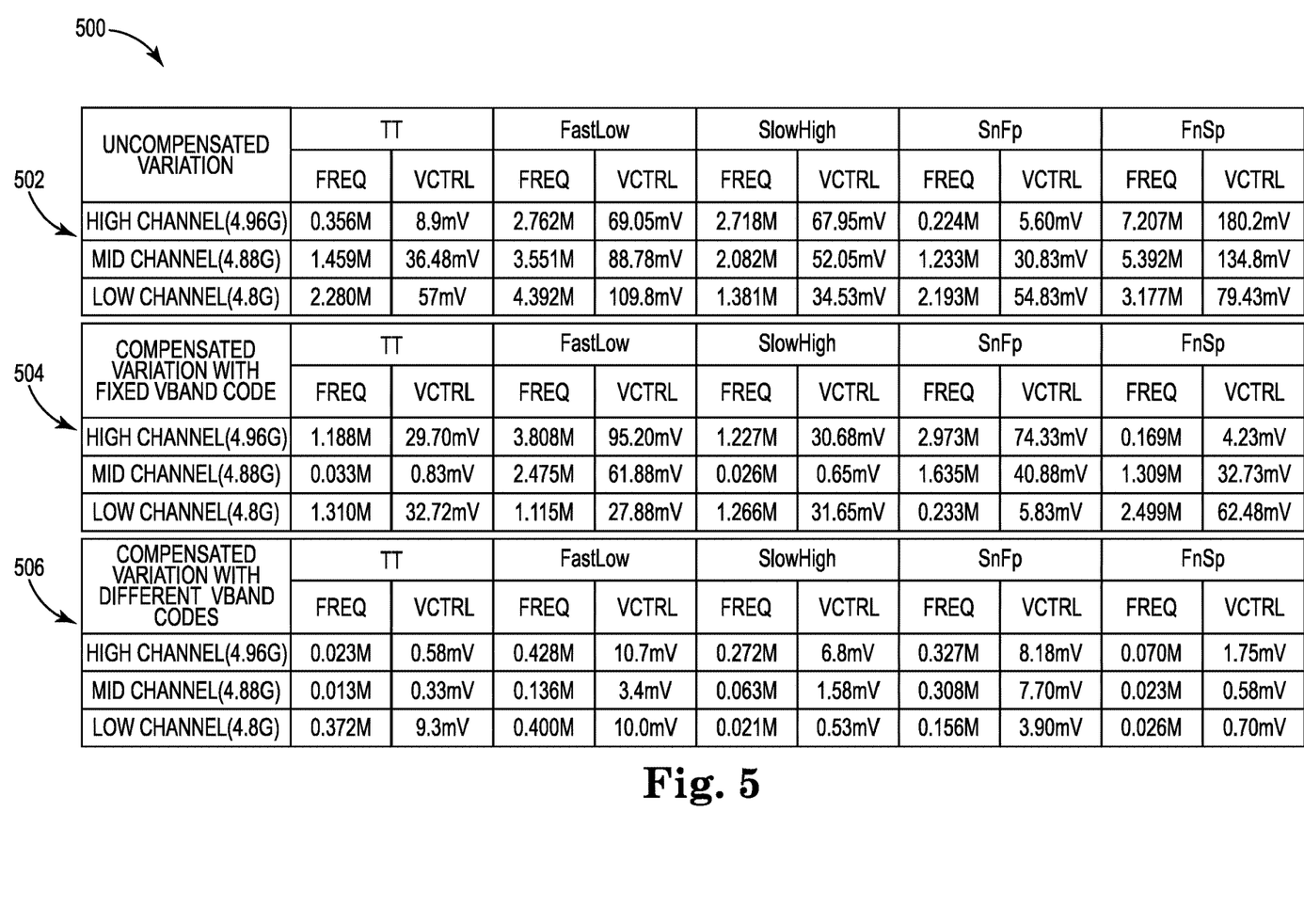
FIG. 5 is a diagram illustrating a table of frequency drift compensation simulation results according to an example.

FIG. 5 is a diagram illustrating a table 500 of frequency drift compensation simulation results according to an example. The table 500 includes a first set of simulation results 502 for an uncompensated VCO, a second set of simulation results 504 for a compensated VCO using a fixed VBAND code, and a third set of simulation results 506 for a compensated VCO using different VBAND codes. The VBAND code corresponds to the compensation control signal (e.g., $V_{band\_comp}$ applied to common anode connection 248 in FIG. 2). Each of the three sets of simulation results includes frequency (Freq) values and $V_{ctrl}$ values for five different process corners, which are Typical-Typical (TT), FastLow, SlowHigh, Slow-n Fast-p (SnFp), and Fast-n Slow-p (FnSp), and three different frequency bands, which are high channel (4.96 GHz), mid channel (4.88 GHz), and low channel (4.8 GHz). $V_{ctrl}$ corresponds to the control voltage ($V_{ctrl}$) applied to the common anode connection 228 (FIG. 2). $V_{ctrl}$ is calculated assuming a KVCO of 40 MHz/V. The frequency values represent the frequency change from the frequency at 0° C. and the frequency at 60° C.

The uncompensated VCO with the first set of simulation results 502 may have problems passing stable modulation index and modulation characteristics tests. The second set of simulation results 504 for the compensated VCO using a fixed VBAND code indicates that the frequency variation can be compensated in the TT, FastLow, SlowHigh, and FnSp process corner, but is less effective in the SnFp process corner. A reason for this is that the frequency variation over temperature can be PTAT, CTAT, or NTAT, so applying only one type of cancellation can potentially hurt the performance in other situations. The third set of simulation results 506 for the compensated VCO using different VBAND codes for different process corners and different frequency bands indicates that the frequency variation can be compensated across corners and frequency bands. The illustrated results indicate that the maximum frequency variation has been compensated from 7.207 MHz in the first set of results 502 to 0.428 MHz in the third set of results 506, which is about a 94% reduction.

Examples disclosed herein may be applied to low power applications (e.g., Bluetooth and Bluetooth Low Energy, BLE), as well as high power applications, such as a WiFi transmitter, to provide stable performance over temperature. Examples disclosed herein may be used to compensate frequency drift that might be caused by the power amplifier heating up while transmitting long packets, which might otherwise cause a loss in PLL lock.

One example of the present disclosure is directed to a voltage controlled oscillator, which includes an inductor, a capacitor coupled to the inductor, and a signal source coupled to the inductor and the capacitor to sustain an oscillating signal. The voltage controlled oscillator includes a first varactor coupled to the inductor and the capacitor, wherein the first varactor is biased by a first bias voltage and is configured to change a frequency of the oscillating signal based on a first control voltage signal. The voltage controlled oscillator includes a second varactor coupled to the inductor, the capacitor, and the first varactor, wherein the second varactor is biased by a second bias voltage and is configured to compensate temperature variation of the frequency of the oscillating signal over a plurality of frequency bands based on second control voltage signal.

The first varactor may include a first pair of varactor diodes having a first common anode connection, and the second varactor may include a second pair of varactor diodes having a second common anode connection. The first control voltage signal may be coupled to the first common anode connection, and the second control voltage signal may be coupled to the second common anode connection. The first bias voltage may be coupled to cathodes of the first pair of varactor diodes, and the second bias voltage may be coupled to cathodes of the second pair of varactor diodes. The second pair of varactor diodes may be coupled in parallel to the first pair of varactor diodes via at least one coupling capacitor. The voltage controlled oscillator may be configured to be selectively operated at a plurality of different frequency bands. The second control voltage signal may vary based on a current temperature and a current frequency band of operation of the voltage controlled oscillator. The second control voltage signal may vary based on a current temperature and a process variation category of the voltage controlled oscillator.

The voltage controlled oscillator may further include an inductor-capacitor (LC) tank resonator circuit including the inductor and the capacitor, wherein the LC tank resonator circuit is configured to change the frequency band of the voltage controlled oscillator based on a digital control signal, and wherein the first varactor is configured to make a fine change to the frequency of the voltage controlled oscillator based on the first control voltage signal. The LC tank resonator circuit may include a plurality of capacitors that are configured to be selectively connected and disconnected from the LC tank resonator circuit based on the digital control signal. The voltage controlled oscillator may further include a proportional-to-absolute-temperature (PTAT) signal source, a negative-to-absolute-temperature (NTAT) signal source, and a constant-to-absolute-temperature (CTAT) signal source. The PTAT signal source may be configured to generate the second control voltage signal to compensate NTAT frequency variations; the NTAT signal source may be configured to generate the second control voltage signal to compensate PTAT frequency variations; and the CTAT signal source may be configured to compensate CTAT frequency variations.

Figure 6:
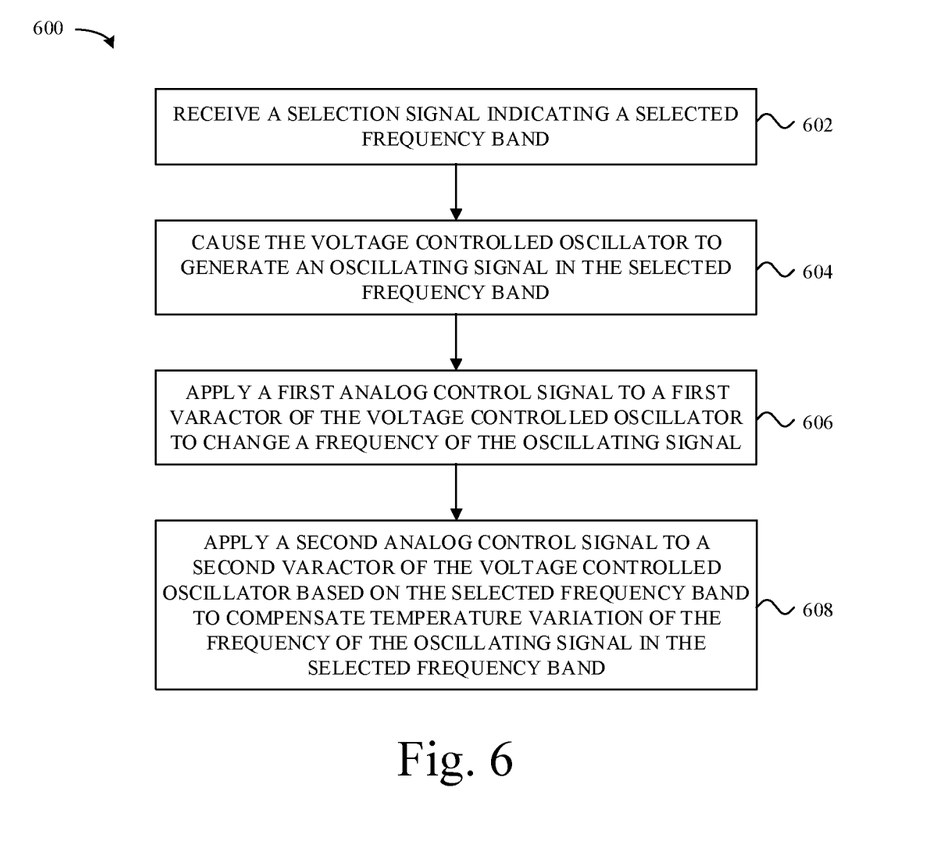
FIG. 6 is a flow diagram illustrating a method of controlling a VCO according to an example.

Another example of the present disclosure is directed to a method of controlling a voltage controlled oscillator. FIG. 6 is a flow diagram illustrating a method 600 of controlling a voltage controlled oscillator according to an example. At 602, the method 600 includes receiving a selection signal indicating a selected frequency band. At 604, the method 600 includes causing the voltage controlled oscillator to generate an oscillating signal in the selected frequency band. For example, in response to a selection signal indicating a selected frequency band, one or more of the capacitor stages 210 of VCO 108 (FIG. 2) may be switched on (i.e., switch 214 for the selected stage is closed), while the switches 214 for the remaining capacitor stages 210 remain open, to generate the oscillating signal in the selected frequency band. At 606, the method 600 includes applying a first analog control signal to a first varactor of the voltage controlled oscillator to change a frequency of the oscillating signal. For example, the control voltage ($V_{ctrl}$) may be applied to the common anode connection 228 of the varactor 225 (FIG. 2) to change a frequency of the oscillating signal. At 608, the method 600 includes applying a second analog control signal to a second varactor of the voltage controlled oscillator based on the selected frequency band to compensate temperature variation of the frequency of the oscillating signal in the selected frequency band. For example, the compensation control voltage ($V_{band\_comp}$) may be applied to the common anode connection 248 of the varactor 245 (FIG. 2) based on the selected frequency band to compensate temperature variation of the frequency of the oscillating signal in the selected frequency band.

The method 600 may further include identifying a temperature-based frequency variation of the voltage controlled oscillator circuit (see, e.g., block 404 of FIG. 4); determining whether the frequency variation is proportional to absolute temperature (PTAT), negative to absolute temperature (NTAT), or constant to absolute temperature (CTAT) (see, e.g., blocks 414, 410, and 418, respectively, of FIG. 4); and applying NTAT compensation with the second analog control signal if it is determined that the frequency variation is PTAT (see, e.g., block 416 of FIG. 4). The method 600 may further include applying PTAT compensation with the second analog control signal if it is determined that the frequency variation is NTAT (see, e.g., block 412 of FIG. 4); and applying CTAT compensation with the second analog control signal if it is determined that the frequency variation is CTAT (see, e.g., block 420 of FIG. 4). The PTAT, NTAT, and CTAT compensation may be accomplished, for example, by using, as shown in FIG. 3, the PTAT signal source 314, NTAT signal source 316, and CTAT signal source 318, respectively, to apply the second analog control signal to the common anode connection 248 under the control of controller 304.

The method 600 may further include receiving a second selection signal indicating a second selected frequency band; causing the voltage controlled oscillator to generate an oscillating signal in the second selected frequency band; and modifying the second analog control signal based on the second selected frequency band to compensate temperature variation of the frequency of the oscillating signal. For example, in response to a second selection signal indicating a second selected frequency band, a different set of the capacitor stages 210 of VCO 108 (FIG. 2) may be switched on (i.e., switch 214 for the selected stage is closed), while the switches 214 for the remaining capacitor stages 210 remain open, to generate the oscillating signal in the second selected frequency band. The compensation control voltage ($V_{band\_comp}$) applied to the common anode connection 248 of the varactor 245 (FIG. 2) may be modified based on the second selected frequency band to compensate temperature variation of the frequency of the oscillating signal. The method 600 may further include modifying the second analog control signal based on a process variation category of the voltage controlled oscillator to compensate temperature variation of the frequency of the oscillating signal. For example, the compensation control voltage ($V_{band\_comp}$) applied to the common anode connection 248 of the varactor 245 (FIG. 2) may be modified based on a process variation category of VCO 108 to compensate temperature variation of the frequency of the oscillating signal.

Another example of the present disclosure is directed to an electronic system for producing an oscillating signal. The electronic system includes an inductor-capacitor (LC) tank resonator circuit; a signal source coupled to the LC tank resonator circuit to sustain an oscillating signal; a first varactor coupled to the LC tank resonator circuit; and a second varactor coupled to the first varactor. The electronic system further includes a controller configured to: cause the LC tank resonator circuit to generate the oscillating signal in a selected frequency band; cause the first varactor to modify a frequency of the oscillating signal; and cause the generation of an analog control signal based on the selected frequency band to control the second varactor to compensate temperature variation of the frequency of the oscillating signal.

The LC tank resonator circuit may be configured to be selectively operated at a plurality of different frequency bands, and the controller may be configured to cause a different analog control voltage signal to be generated for each of the different frequency bands. The second varactor may include a pair of varactor diodes having a common anode connection, and wherein the analog control signal may be coupled to the second common anode connection.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

What is claimed is:

1. A voltage controlled oscillator, comprising:
an inductor;
a capacitor coupled to the inductor;
a signal source coupled to the inductor and the capacitor to sustain an oscillating signal;
a first varactor coupled to the inductor and the capacitor, wherein the first varactor is biased by a first bias voltage and is configured to change a frequency of the oscillating signal based on a first control voltage signal;
a second varactor coupled to the inductor, the capacitor, and the first varactor, wherein the second varactor is biased by a second bias voltage and is configured to compensate temperature variation of the frequency of the oscillating signal over a plurality of frequency bands based on a second control voltage signal; and
a third varactor coupled to the inductor, the capacitor, and the first varactor, wherein the third varactor is biased by a third bias voltage, wherein the first bias voltage and the second bias voltage are the same voltages, and wherein the first bias voltage and the third bias voltage are different voltages.

2. The voltage controlled oscillator of claim 1, wherein the first varactor comprises a first pair of varactor diodes having a first common anode connection, wherein the second varactor comprises a second pair of varactor diodes having a second common anode connection, wherein the third varactor comprises a third pair of varactor diodes having a third common anode connection, and wherein the second common anode connection is coupled to the third common anode connection.

3. The voltage controlled oscillator of claim 2, wherein the first control voltage signal is coupled to the first common anode connection, and wherein the second control voltage signal is coupled to the second common anode connection and the third common anode connection.

4. The voltage controlled oscillator of claim 3, wherein the first bias voltage is coupled to cathodes of the first pair of varactor diodes, and wherein the second bias voltage is coupled to cathodes of the second pair of varactor diodes, and wherein the third bias voltage is coupled to cathodes of the third pair of varactor diodes.

5. The voltage controlled oscillator of claim 2, wherein the second pair of varactor diodes is coupled in parallel to the first pair of varactor diodes via at least one coupling capacitor.

6. The voltage controlled oscillator of claim 1, wherein the voltage controlled oscillator is configured to be selectively operated at a plurality of different frequency bands.

7. The voltage controlled oscillator of claim 1, wherein the second control voltage signal varies based on a current temperature and a current frequency band of operation of the voltage controlled oscillator.

8. The voltage controlled oscillator of claim 1, wherein the second control voltage signal varies based on a current temperature and a process variation category of the voltage controlled oscillator.

9. The voltage controlled oscillator of claim 1, and further comprising:
an inductor-capacitor (LC) tank resonator circuit including the inductor and the capacitor and the third varactor, wherein the LC tank resonator circuit is configured to change a frequency band of operation of the voltage controlled oscillator based on a digital control signal, and wherein the first varactor is configured to make a fine change to the frequency band of operation of the voltage controlled oscillator based on the first control voltage signal.

10. The voltage controlled oscillator of claim 9, wherein the LC tank resonator circuit includes a plurality of capacitors that are configured to be selectively connected and disconnected from the LC tank resonator circuit based on the digital control signal.

11. The voltage controlled oscillator of claim 1, and further comprising a proportional-to-absolute-temperature (PTAT) signal source, a negative-to-absolute-temperature (NTAT) signal source, and a constant-to-absolute-temperature (CTAT) signal source.

12. The voltage controlled oscillator of claim 11, wherein the PTAT signal source is configured to generate the second control voltage signal to compensate NTAT frequency variations, wherein the NTAT signal source is configured to generate the second control voltage signal to compensate PTAT frequency variations, and wherein the CTAT signal source is configured to compensate CTAT frequency variations.

13. A method for controlling a voltage controlled oscillator, the method comprising:
receiving a selection signal indicating a selected frequency band;
causing the voltage controlled oscillator to generate an oscillating signal in the selected frequency band;
applying a first analog control signal to a first varactor of the voltage controlled oscillator to change a frequency of the oscillating signal, wherein the first varactor is biased by a first bias voltage;
applying a second analog control signal to a second varactor of the voltage controlled oscillator based on the selected frequency band to compensate temperature variation of the frequency of the oscillating signal in the selected frequency band, wherein the second varactor is biased by a second bias voltage; and
applying the first analog control signal to a third varactor of the voltage controlled oscillator, wherein the third varactor is biased by a third bias voltage, wherein the first bias voltage and the second bias voltage are the same voltages, and wherein the first bias voltage and the third bias voltage are different voltages.

14. The method of claim 13, and further comprising:
identifying a temperature-based frequency variation of the voltage controlled oscillator;
determining whether the frequency variation is proportional to absolute temperature (PTAT), negative to absolute temperature (NTAT), or constant to absolute temperature (CTAT); and
applying NTAT compensation with the second analog control signal if it is determined that the frequency variation is PTAT.

15. The method of claim 14, and further comprising:
applying PTAT compensation with the second analog control signal if it is determined that the frequency variation is NTAT; and
applying CTAT compensation with the second analog control signal if it is determined that the frequency variation is CTAT.

16. The method of claim 13, and further comprising:
receiving a second selection signal indicating a second selected frequency band;
causing the voltage controlled oscillator to generate an oscillating signal in the second selected frequency band; and
modifying the second analog control signal based on the second selected frequency band to compensate temperature variation of the frequency of the oscillating signal.

17. The method of claim 13, and further comprising:
modifying the second analog control signal based on a process variation category of the voltage controlled oscillator to compensate temperature variation of the frequency of the oscillating signal.

18. An electronic system for producing an oscillating signal, comprising:
an inductor-capacitor (LC) tank resonator circuit;
a signal source coupled to the LC tank resonator circuit to sustain an oscillating signal;
a first varactor coupled to the LC tank resonator circuit, wherein the first varactor is biased by a first bias voltage;
a second varactor coupled to the first varactor, wherein the second varactor is biased by a second bias voltage, wherein the first bias voltage and the second bias voltage are the same voltages;
a third varactor coupled to the first varactor, wherein the third varactor is biased by a third bias voltage, wherein the first bias voltage and the third bias voltage are different voltages; and
a controller configured to: cause the LC tank resonator circuit to generate the oscillating signal in a selected frequency band; cause the first varactor to modify a frequency of the oscillating signal; and cause the generation of an analog control signal based on the selected frequency band to control the second varactor to compensate temperature variation of the frequency of the oscillating signal.

19. The electronic system of claim 18, wherein the LC tank resonator circuit is configured to be selectively operated at a plurality of different frequency bands, and wherein the controller is configured to cause a different analog control voltage signal to be generated for each of the different frequency bands.

20. The electronic system of claim 18, wherein the second varactor comprises a pair of varactor diodes having a first common anode connection, wherein the second varactor comprises a second pair of varactor diodes having a second common anode connection, wherein the third varactor comprises a third pair of varactor diodes having a third common anode connection, and wherein the second common anode connection is coupled to the third common anode connection, and wherein the analog control signal is coupled to the second common anode connection.

* * * * *